United States Patent [19]
Liberkowski

[11] Patent Number: 5,691,209
[45] Date of Patent: Nov. 25, 1997

[54] LATTICE INTERCONNECT METHOD AND APPARATUS FOR MANUFACTURING MULTI-CHIP MODULES

[76] Inventor: Janusz B. Liberkowski, 5884 Macadam Ct., San Jose, Calif. 95123

[21] Appl. No.: 731,470

[22] Filed: Oct. 15, 1996

Related U.S. Application Data

[62] Division of Ser. No. 527,959, Sep. 14, 1995, Pat. No. 5,623,160.

[51] Int. Cl.[6] ............................................. H01L 21/00
[52] U.S. Cl. .......................... 437/7; 437/195; 437/915; 437/922
[58] Field of Search ........................... 437/7, 8, 195, 437/214, 915, 922; 148/DIG. 55

[56] References Cited

U.S. PATENT DOCUMENTS

| | | | |
|---|---|---|---|
| 4,353,040 | 10/1982 | Krumm et al. | 333/1 |
| 4,450,029 | 5/1984 | Holbert et al. | 156/250 |
| 4,457,803 | 7/1984 | Takigawa | 156/626.1 |
| 4,458,297 | 7/1984 | Stopper et al. | 361/771 |

(List continued on next page.)

OTHER PUBLICATIONS

Integral Decoupling Capacitance Reduces Multichip Module Ground Bounce, Todd Takken, Dept. of Electrical Engineering, Standford, 1993, IEEE, pp. 79–84.

An Overview of Multichip Modules, Predeep Lall et al., Advanced Device Packaging, Sep., 1993, Solid State Technology, pp. 65–72.

Laser Ablation and Laser Etching, J. Boulmet et al., Institut d'Electronique Fondamentale, Paris, France (No Date).

Comparison of the Ablation of Dielectrics and Metals at High and Low Laser Powers, R. W. Dreyfus, IBM Research Division, New York (No Date).

SiC Film Deposited by Pulse Laser Ablation, Mat. Res. Soc. Symp., vol. 191, p. 61 (1990) (copy not enclosed).

L. Rimai et al., Deposition of Thin Films of Silicon Carbide on Fused Quartz and on Sapphire by Laser Ablation of Ceramic Silicon Carbide Targets, Mat. Res. Soc. Symp., vol. 285, p. 495 (1993) (copy not enclosed).

M.A. El Khakani et al., Deposition of Silicon Carbide Thin Films by Pulsed Excimer Laser Ablation Technique in the (25–700)° C. Deposition Temperature Range, Proc. SPIE, vol. 2403 (1995) (copy not enclosed).

*Primary Examiner*—Chandra Chaudhari
*Attorney, Agent, or Firm*—Kolisch, Hartwell, Dickinson, McCormack & Heuser

[57] ABSTRACT

Method and apparatus for interconnecting integrated circuits (ICs) are described. The invented lattice is formed in a plural-layer structure whereby each required interconnect signal has one or more dedicated layers of a planar, thin-film conductor coextensive with the substrate. Thousands of such horizontal layers are vertically stacked in the structure, each being shielded by voltage or ground planes and insulated by layers of dielectric material. A regular array of vertical pillars is provided in the substrate, each pillar providing an inner conductor electrically connected with a conductive layer or electrically insulated by an insulative region. The columns extend from the top of the substrate on which the ICs are mounted through to the bottom surface of the bottom layer. The pillars may be selectively disconnected from the layers by fusing techniques, or, alternatively, the pillars may be selectively connected to the layers by anti-fusing techniques. In one embodiment, the interconnection region between a pillar and a layer is switchably programmable to either interconnect or disconnect via a semiconductor switching device such as a transistor fabricated in the lattice interconnect structure, whereby each pillar's interface with each layer may be selectively and alterably defined as being conductive or insulative. Preferably, each column includes a bonding pad on the upper surface for mounting or wire bonding of selected I/O contacts of the ICs. Voltage and ground planes may be rendered in the same substrate by fusing or anti-fusing of selected vias so they are electrically connected with a given plane representing a voltage or ground, which may be performed by forming vias and selectively plating, by photolithography.

6 Claims, 7 Drawing Sheets

U.S. PATENT DOCUMENTS

| | | | |
|---|---|---|---|
| 4,498,122 | 2/1985 | Rainal | 361/794 |
| 4,598,166 | 7/1986 | Neese | 174/261 |
| 4,698,129 | 10/1987 | Puretz et al. | 156/643.1 |
| 4,796,269 | 1/1989 | DeFreeze et al. | 372/50 |
| 4,797,892 | 1/1989 | DeFreeze et al. | 372/50 |
| 4,827,327 | 5/1989 | Miyauchi et al. | 257/700 |
| 4,888,665 | 12/1989 | Smith | 361/780 |
| 4,899,439 | 2/1990 | Potter et al. | 29/846 |
| 5,057,877 | 10/1991 | Briley et al. | 257/700 |
| 5,061,824 | 10/1991 | Alexander et al. | 174/250 |
| 5,136,471 | 8/1992 | Inasaka | 361/794 |
| 5,137,836 | 8/1992 | Lam | 437/915 |
| 5,216,806 | 6/1993 | Lam | 29/848 |
| 5,222,014 | 6/1993 | Lin | 361/792 |
| 5,241,450 | 8/1993 | Bernhardt et al. | 361/689 |
| 5,247,423 | 9/1993 | Lin et al. | 361/719 |
| 5,264,664 | 11/1993 | McAllister et al. | 174/261 |
| 5,264,729 | 11/1993 | Rostoker et al. | 257/700 |
| 5,306,670 | 4/1994 | Mowatt et al. | 437/214 |
| 5,309,024 | 5/1994 | Hirano | 257/773 |
| 5,314,480 | 5/1994 | Schepis et al. | 437/922 |
| 5,314,840 | 5/1994 | Schepis et al. | 437/170 |
| 5,319,238 | 6/1994 | Gordon et al. | 257/530 |
| 5,325,268 | 6/1994 | Nachnani et al. | 361/767 |
| 5,327,327 | 7/1994 | Frew et al. | 361/784 |
| 5,329,157 | 7/1994 | Rosotker | 257/666 |
| 5,341,092 | 8/1994 | El-Ayat et al. | 324/750 |
| 5,349,248 | 9/1994 | Parlour et al. | 326/38 |
| 5,359,493 | 10/1994 | Chiu | 361/719 |
| 5,373,109 | 12/1994 | Argyrakis et al. | 174/117 |
| 5,408,130 | 4/1995 | Woo et al. | 257/758 |
| 5,475,264 | 12/1995 | Sudo et al. | 257/723 |

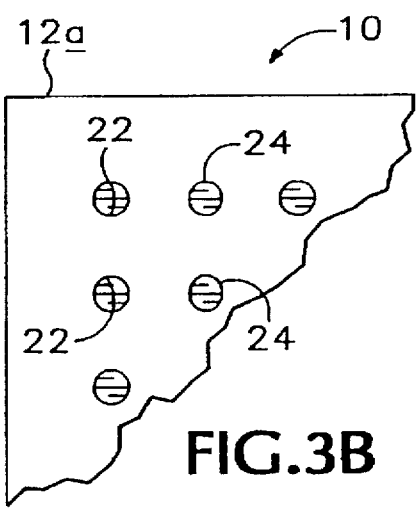
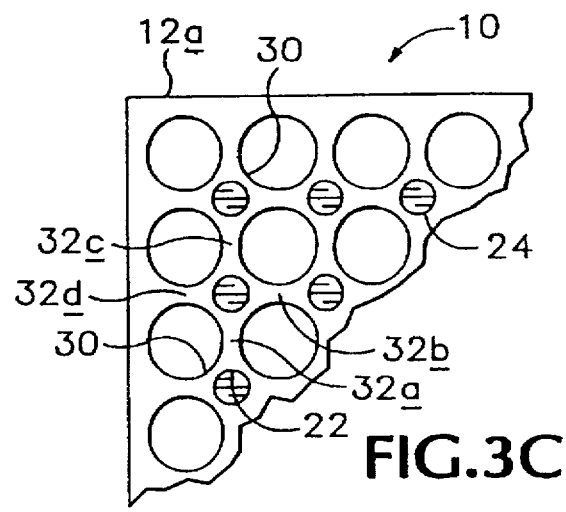
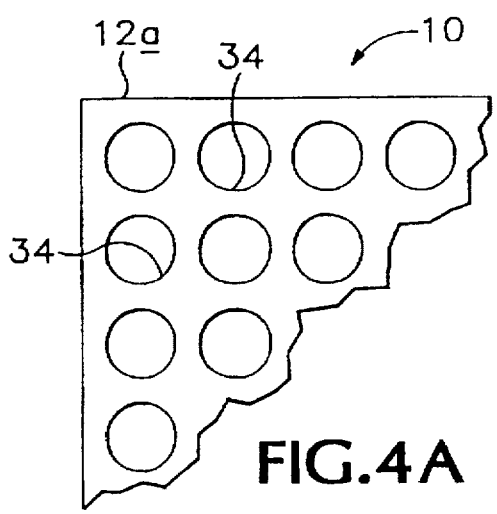
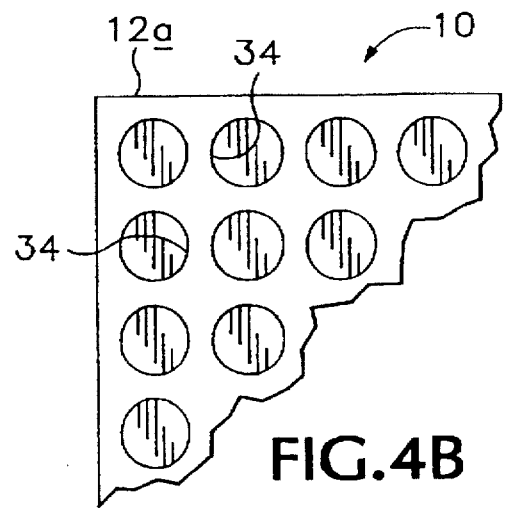
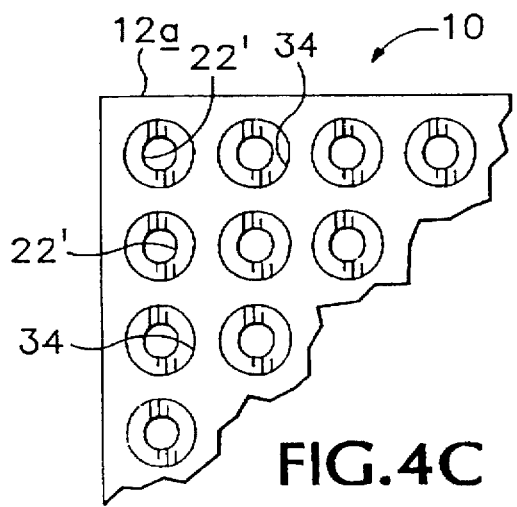
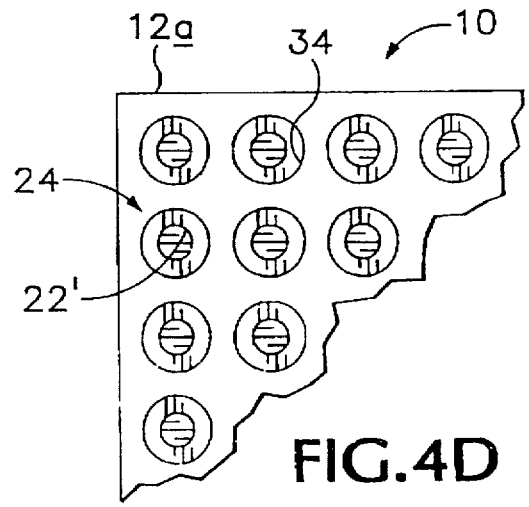

LATTICE INTERCONNECT METHOD AND APPARATUS FOR MANUFACTURING MULTI-CHIP MODULES

This is a divisional of application Ser. No. 08/527,959 filed Sep. 14, 1995 now U.S. Pat. No. 5,623,160.

TECHNICAL FIELD

The present invention relates generally to multi-chip circuit module interconnections. More particularly, it concerns a lattice interconnect method and apparatus that utilizes semiconductor materials and processes in a structure containing plural dedicated planar signal layers and power/ground layers that are vertically stacked and selectively connected to define interconnect nodes for integrated circuits (ICs) mounted on the surface of the apparatus to produce multi-chip modules (MCMs) or like electronic circuitry and systems.

BACKGROUND ART

Traditionally integrated circuit modules are mounted on a resin-based copper clad circuit board providing for the interconnection of signals between circuit modules or chips. Such interconnects typically are made by photolithographic and etching techniques that leave a circuit pattern representing the routing of a signal from one circuit node to one or more other circuit nodes. Such printed circuit or wiring board (PCB or PWB) techniques are compatible with the production of a more recent advent of multi-chip modules (MCMs). Typically, MCMs mount ICs on thin-film substrates mounted, in turn, on a rigid carrier. For example, signal, power and ground traces are laid down using conventional routing PCB or PWB techniques on 6–7 layer substrates, e.g. by photolithographic masking, etching and/or sputtering, to provide the needed increased signal routing densities. An overview of conventional MCM production techniques is presented in AN OVERVIEW OF MULTI-CHIP MODULES, by Pradeep Lall, et al., which was published in September 1993 in *Solid State Technology* magazine, with which familiarity is assumed.

There are limits to the number of signals that may be routed using such techniques, since there are signal crosstalk, current density and heat build-up concerns with increasingly tiny signal conductor widths (in the micron range) and with increasing signal conductor routing densities or pitches (also in the micron range). Practically speaking, no more than a few hundred interconnections may be provided with conventional techniques in boards of modest size and packing density.

U.S. Pat. No. 4,498,122 entitled HIGH-SPEED, HIGH PIN-OUT LSI CHIP PACKAGE, which issued Feb. 5, 1985, teaches the use of vertical metal pillars, or vias, to route signals between layers of a multi-layer PCB having power and ground planes, and also teaches the use of dielectric material to separate adjacent layers, each of which routes signals between vias unidirectionally and otherwise by conventional photolithographic tiny signal conductor routing techniques. That patent does not suggest the dedication of a layer to each interconnect signal. Nor does that patent suggest substrate programmability nor the rendering of each signal layer substantially coextensive with the substrate.

U.S. Pat. No. 4,888,665 entitled CUSTOMIZABLE CIRCUITRY, which issued Dec. 19, 1989, teaches a programmable interconnect circuit that uses orthogonally extending multi-wire layers adjacent ones of which can be fused and anti-fused as necessary to program interconnect nodes. That patent does not teach through vias nor dedicated per-signal interconnect extensive planar multi-layers in a programmable MCM or like structure.

U.S. Pat. No. 4,899,439 entitled METHOD OF FABRICATING A HIGH DENSITY ELECTRICAL INTERCONNECT, which issued Feb. 13, 1990, teaches orthogonal X and Y conductor strips and corresponding X and Y metal pillars fabricated to electrically connect therewith, with an X and a Y crossing being rendered conductive by providing a metal conducting pillar segment therebetween. A ground plane provided on the substrate avoids electrical contact with the vertical pillars by forming insulating buffer regions therearound. Conventional deposition techniques are used to provide $SiO_2$ insulation and Cu conductors, with the three-dimensional lattice being filled with an air or other desired dielectric. That patent does not teach dedicated per-signal interconnect extensive planar multi-layers in a programmable MCM or like structure.

U.S. Pat. No. 5,264,664 entitled PROGRAMMABLE CHIP TO CIRCUIT BOARD CONNECTOR, which issued Nov. 23, 1993, teaches a programmable chip-to-PCB interconnections using a matrix of connection pads and associated regularly arrayed vias, the programming being performed by masked metal deposition to bridge a selected via and a selected pad. Selectively deposited passivation layers of polyamide protect against inadvertent bridging of via/pad gaps during chip lead soldering. FIG. 4 shows plural vertical vias extending to different depths to provide an interconnect with one of plural mesh planes, which are voltage or ground planes, not signal planes. That patent does not teach dedicated per-interconnect signal, co-extensive planar multi-layers in a MCM or like structure.

U.S. Pat. No. 5,373,109 entitled ELECTRICAL CABLE HAVING FLAT, FLEXIBLE, MULTIPLE CONDUCTOR SECTIONS, which issued Dec. 13, 1994, teaches an electrical wiring cable having flat, flexible, multiple-signal-conductor layers stacked vertically atop one another and insulated by dielectric layers therebetween and having also one or more ground planes, each inner layer for routing a signal from one edge-stepped, conductor-exposing end to another. That patent does, not suggest vertical vias for selective interconnecting of dedicated signal layers and does not suggest MCM substrates or other IC-mounting structures.

Laser ablation and etching represent recent developments applicable to thin film substrates for the removal and deposition of material from a solid surface. Briefly, laser ablation involves excitation of a solid's molecules and larger particles by irradiation by high-power, short-pulse lasering. Laser etching differs therefrom in that it involves 1) chemical reactions, e.g. chemisorption and bulk diffusion, at an interface between a solid surface and a background gas and 2) irradiation to produce desorption of the chemically reacted layer. Laser ablation and etching are believed to lend themselves to highly-controlled, selective removal and deposition of materials in the microcircuit fabrication field where fine patterning is required, and at etch rates similar to those obtained in plasma reactors. Such laser techniques are described in LASER ABLATION AND LASER ETCHING, by Boulmer, et al., which was published in 1992 by Elsevier Science Publishers, B.V. See also COMPARISON OF THE ABLATION OF DIELECTRICS AND METALS AT HIGH AND LOW LASER POWERS, by Dreyfus, which was published in 1992 by Elsevier Science Publishers, B.V. Familiarity with these publications is assumed.

DISCLOSURE OF THE INVENTION

The invented lattice preferably is formed in a plural-layer structure whereby each required interconnect signal has one or more dedicated layers of a planar, thin-film conductor that is coextensive with the substrate. Thousands of such horizontal layers are vertically stacked in the structure, each being shielded by voltage or ground planes and each being insulated by layers of insulative dielectric material. A regular array of vertical pillars is provided in the substrate, each pillar effectively providing a conductor that is selectively connectable with or disconnectable from each of the conductive layers.

Three different techniques for making such selective interconnections are described. First, the conductor within the pillar may be provided with an outer insulating sleeve that may be selectively rendered conductive, e.g. pillars may have an outer collar made of an amorphous silicon or other semiconductor material that may be rendered permanently conductive by the application of external voltages at selected pillar(s) to provide desired interconnections. This first technique will be referred to herein as anti-fusing. Second, each pillar may be fabricated to provide one or more fusible links between the vertical, columnar conductor and the planar conductor layer, with each pillar permanently disconnectable from each layer by fusing the links surrounding the given pillar and with the remnant pillars providing a desired interconnection. This second technique will be referred to herein as fusing. Third, a hybrid technique is described in which the conductor within each pillar is switchably, and temporarily, connectable or disconnectable (rendered conductive or insulative) to the conductive layer by driving one or more transistors into alternately current-passing or current-blocking states. This third technique will be referred to herein as switching.

In keeping with all three techniques, the pillars or columns extend from the top of the substrate on which the ICs are mounted through to the bottom surface of the bottom layer, thus they may be referred to as through vias. If 2,000 signal interconnects were required, then at least 2,000 layers would be provided in the substrate (with the remainder being reserved for expansion or repair, or both). Preferably, more than 2,000 columns would be provided, each having a bonding pad on the upper structure surface for surface mounting or wire bonding of selected I/O contacts of the ICs.

In order to perform the interconnection, means is provided for selectively connecting the conductor material of one or more of the pillars to the conductive plane in a given layer. Thus, a signal connection, or node, is established that provides for the electrical interconnection between any two or more terminals of any number of ICs. It will be appreciated that the selective fusing of associated links surrounding a given one or more of the pillars on a selected layer's conductive node plane renders such selected pillars unconnected, thereby effecting a desired one or more interconnections of the remaining, unfused pillars. Alternatively in accordance with the invented method, an insulative cylindrical region around a selected one or more of the pillars on a selected layer's conductive node plane is anti-fused, or bridged, as by re-aligning its amorphous structure, thereby effecting a desired one or more interconnections corresponding with such selected pillars while leaving the remaining pillars unconnected. Finally in accordance with the invented method, one or more programmable transistors or other switching devices is fabricated in a region extending between a given conductor within a pillar and a given conductor within a given layer thereby selectively via programming the state of the switching device to produce a node thereat by interconnection therebetween. Such selective interconnection, in accordance with invention, may be done by any appropriate means, e.g. physical (as by conventional masking and selective plating or etching), electrical (as by applying a voltage difference across one or more planes and one or more selected pillars) or optical (as by use of a laser to switch the semiconductor to a conductive state) means. It also is possible to render the amorphous silicon pillars switchably interconnectable, as by the hybrid technique described briefly above, by the use of integral semiconductor transistors as switches that temporarily and perhaps indefinitely change the conductive nature of the semiconductor at the interface between a selected pillar and a selected plane. Such is analogous to an erasable/ programmable or electrically alterable read-only memory (EPROM or EAROM), but in the form of an interconnect structure for mounting ICs. Those of skill in the art will appreciate that such transistor or other switchable devices may require periodic reprogramming, analogous to refreshing volatile memory devices such as static RAMs. Nevertheless, such are believed to be useful and cost-effective in applications including particularly early design phases when interconnections are relatively fluid and subject to change.

Voltage and ground planes preferably are rendered in the same substrate by a technique involving the fusing, anti-fusing or switching of selected vias so that they are electrically connected with a given plane representing a voltage or ground potential. Such also may be performed by forming vias and selectively plating them through, as by photolithographic techniques, to produce the desired connections. The voltage and ground planes may be interspersed in desired locations throughout the structure that contains the dedicated signal layers. Those of skill in the art will appreciate that any suitable technique for providing the IC-mounting substrate with power and ground planes is within the spirit and scope of the invention. Importantly, it is the provision of plural buried, planar interconnect layers each dedicated to forming—in cooperation with one or more electrically connected, regularly arrayed columnar vias—an electrical nodal interconnection that provides the significant advantages of a high-performance, easy-to-manufacture, low-cost interconnection structure.

These and additional objects and advantages of the present invention will be more readily understood after consideration of the drawings and the detailed description of the preferred embodiment.

BRIEF DESCRIPTION OF THE DRAWINGS

FIGS. 3A, 3B, 3C and 3D are various views, in enlarged top plan view, of the interconnect structure of FIG. 1, and show progressive phases of a preferred fusing method of fabricating such a structure.

FIGS. 4A, 4B, 4C and 4D are various views, also in enlarged top plan view, of the interconnect structure of FIG. 1, and show progressive phases of a preferred anti-fusing method of fabricating such a structure.

DETAILED DESCRIPTION OF THE PREFERRED EMBODIMENT AND BEST MODE OF CARRYING OUT THE INVENTION

Figure 1:
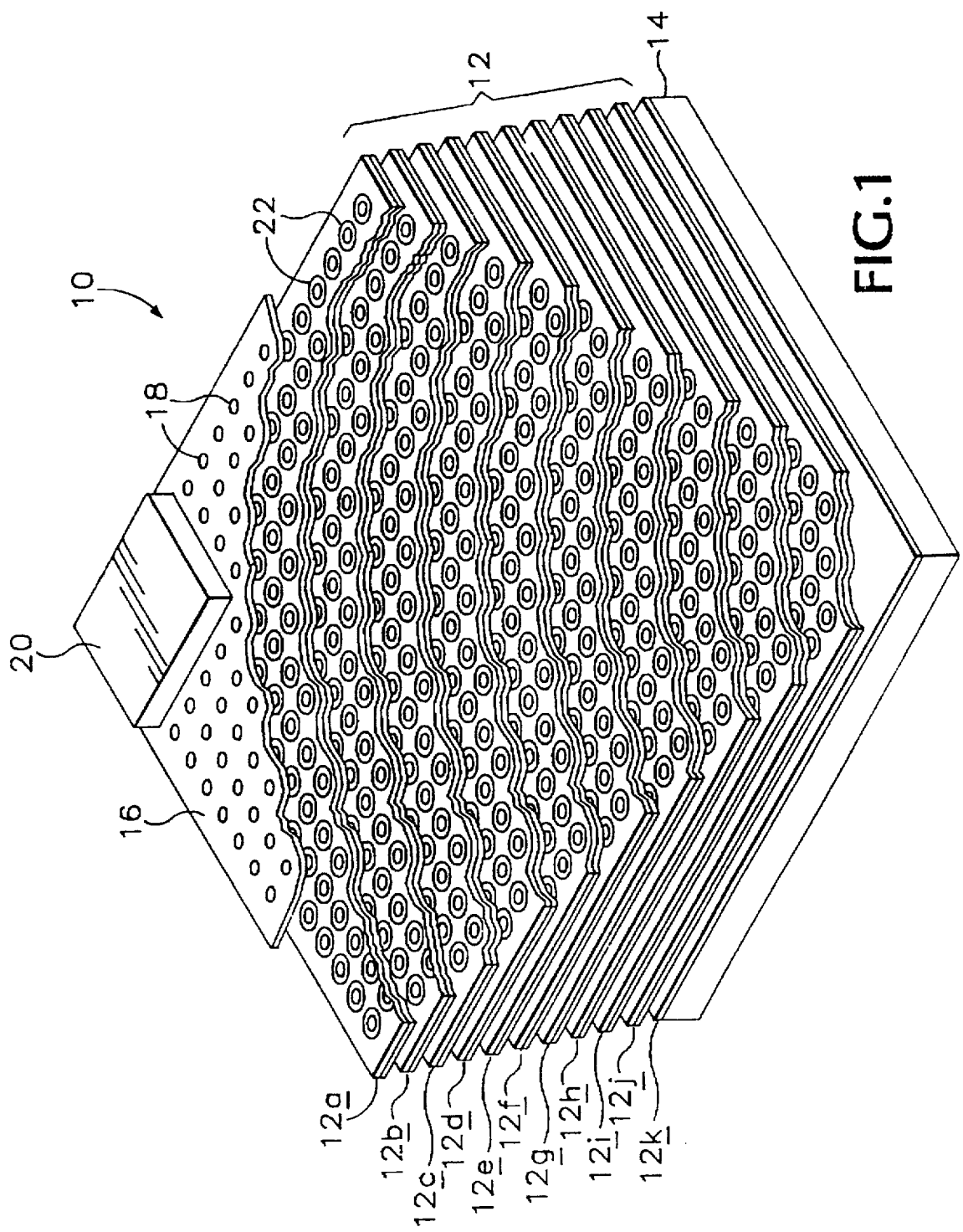
FIG. 1 is an exploded, fragmentary, isometric view of the invented lattice interconnect structure made in accordance with its preferred embodiment.

Turning initially to FIG. 1, the invented lattice interconnect structure made in accordance with a preferred embodiment is indicated generally at 10, in an exploded, fragmentary, isometric view. It will be understood that the illustrated layers 12, e.g. layers 12a, 12b, 12c, 12d, 12e, 12f, 12g, 12h, 12i, 12j, 12k are shown for the sake of clarity progressively deeply fragmented, or cut away, (in arcuately shaped cuts) from the bottom to the top of structure 10, although it will be appreciated that the layers in fact are preferably substantially planar-coextensive. It also will be understood that layers 12 are shown in FIG. 1 as being vertically spaced apart, although it will be appreciated that each layer in fact is preferably in contact with, and preferably adhered to, one or more adjacent layers to form a substantially planar, laminar structure. Those of skill in the art will appreciate that typically there would be many more than eleven layers 12 in the invented structure 10, and that any suitable number is within the spirit and scope of the invention. Those of skill also will appreciate that the thickness of all layers 12 of structure 10 typically might be less than 100 microns thick, and perhaps no more than 8 microns, even in the case where the number of signal layers is as high as 2000.

Plane, planar and planarity herein are used in the broadest sense of the word to refer to an extensive region having substantially greater lateral extent than it has thickness. While in accordance with the preferred embodiment of the invention structure 10 and its stacked laminar layers 12 are relatively thin, flat and two-dimensionally extensive in a plane generally normal to the axis along which the layers are stacked, it will be appreciated that alternative structures wherein, for example, a structure comprising plural laminar layers having extensive regions that are wavy, curved or even angular are within the spirit and scope of the invention.

In accordance with the preferred embodiment of the invention, layers 12 are substantially coextensive with, and parallel planar with, and are mounted on top of, a preferably rigid substrate 14. Not shown in FIG. 1 are pillars, or columnar vias, to be described below, that extend through and substantially normal to aligned layers 12 selectively to interconnect certain of the layers and to provide for an electrically operative connection therebetween. FIG. 1 shows a top dielectric layer 16 providing plural, preferably regularly arrayed connector pads such as pads 18 for mounting one or more ICs, e.g. IC 20. As will be understood presently, the regularly arrayed holes such as holes 22 through each of plural layers 12, which may be seen to be vertically aligned with one another as well as with pads 18, generally represent precursors to the provision of the columnar vias to be described.

Each conductive layer 12 may be made using known thin-film techniques, e.g. metal sputtering and photolithographic techniques, which involves partially ionized beam deposition. Advantageously, each of plural signal layers is identical so that only one or relatively few photoresist masks is required. One preferred method of fabricating each layer 12, including its dielectric and its conductive mesh layers, is by pulsed laser deposition (PLD) of tungsten (W), a conductor, onto silicon carbide (SiC), an insulator of dielectric. These materials are chosen because they have a high-temperature withstand capability and because their deposition and fabrication produces extremely thin, smooth surfaces. See, for example, R. J. Tench et al., *SiC Film Deposited by Pulse Laser Ablation*, Mat. Res. Soc. Symp., vol. 191, p. 61 (1990); L. Rimai et al., *Deposition of Thin Films of Silicon Carbide on Fused Quartz and on Sapphire by Laser Ablation of Ceramic Silicon Carbide Targas*, Mat. Res. Soc. Symp., vol. 285, p. 495 (1993) and M. A. El Khakani et al., *Deposition of Silicon Carbide Thin Films by Pulsed Excimer Laser Ablation Technique in the* (25–700) °C. *Deposition Temperature Range*, Proc. SPIE, vol. 2403 (1995). Those of skill in the art will appreciate that any suitable materials and fabrication processes are within the spirit and scope of the invention.

Figure 2:
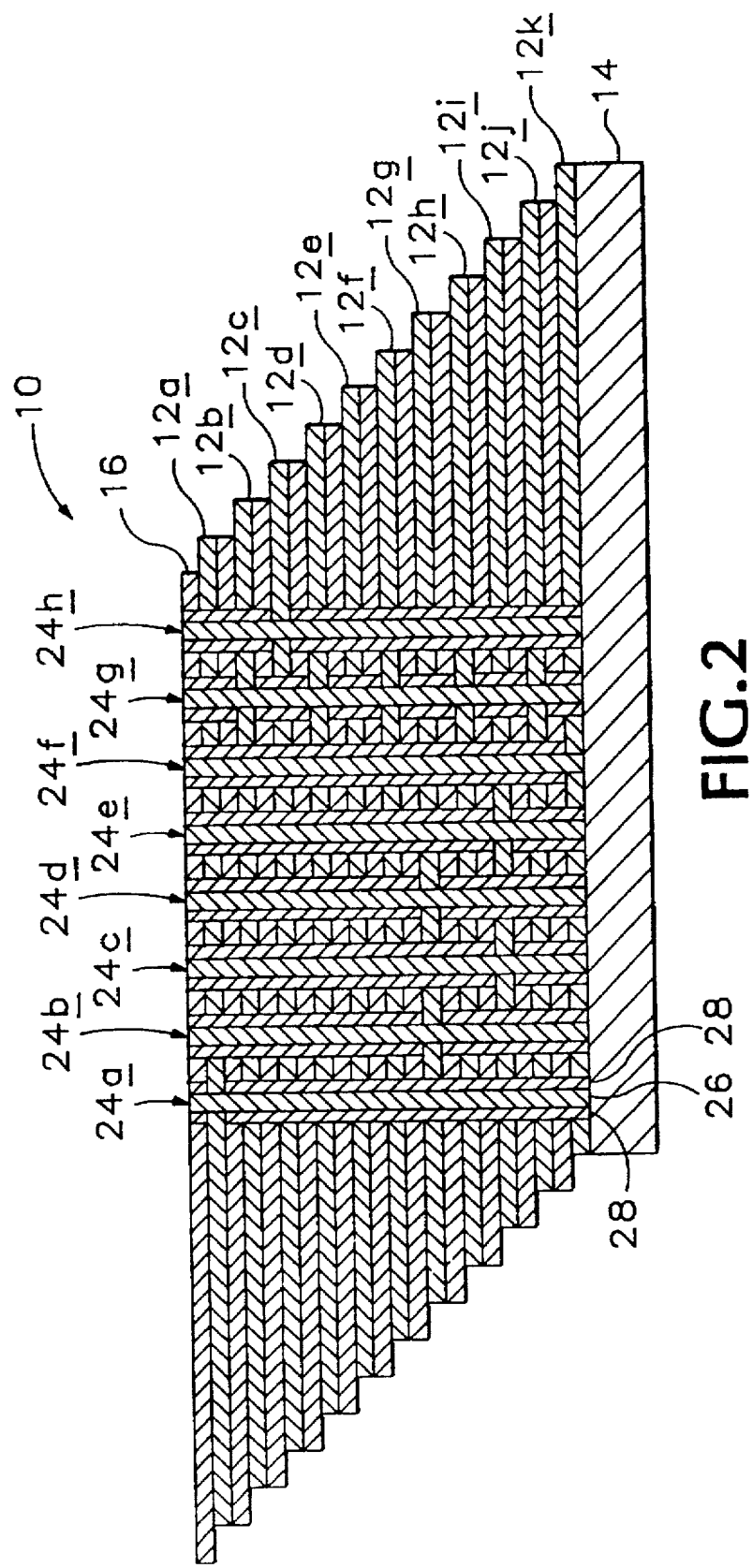
FIG. 2 is a simplified schematic cross section of the invented structure illustrating interconnections that may be rendered therein.

Turning now to FIG. 2, it will be seen generally how such electrical interconnections are rendered within the interior of invented structure 10. FIG. 2 is a schematic, cross-sectional elevation of invented structure 10, and it will be appreciated that feature dimensions including layer thicknesses and lateral offsets are intentionally exaggerated for the sake of clarity. Structure 10 preferably includes columnar vias 24, e.g. vias 24a, 24b, 24c, 24d, 24e, 24f, 24g, 24h extending through layers 12 from the upper surface of dielectric layer 16 to the upper surface of substrate 14. In accordance with a preferred formation method, vias 24 are generally cylindrical and include an inner conductor such as conductor 26 of via 24a and an outer conductor-surrounding outer region such as sleeve 28 of via 24a, the sleeve extending substantially completely around the conductor to electrically insulate the inner conductor from contact with all but a selected one or more of layers 12.

Illustrative of such selective interconnection, it may be seen from FIG. 2 that via 24a is connected only with layer 12a, as is represented schematically in FIG. 2 by the extension of layer 12a through the region of sleeve 28 into electrical, preferably circumferential contact with inner conductor 26. Other connections exist, as may be seen, between via 24b and layer 12g; between each of vias 24c, 24e and layer 12i; between via 24d and layer 12g; between via 24f and layer 12k; between via 24g and each of layers 12b, 12d, 12f, 12h and 12i; and between via 24h and layer 12c. The result of forming selective connections between vias 24b and 24d and layer 12g is that there is an electrically conductive path or interconnection between the two commonly connected vias. Similarly, a conductive path or interconnection exists between vias 24c and 24e as a result of their connections with common layer 12i.

Thus, the invented structure may be seen to provide for the selective interconnection of two or more mounting pads 18 (not shown, for the sake of clarity, in FIG. 2, but shown in FIG. 1) on the structure's upper IC-mounting surface. It will be appreciated, however, that such an interconnection requires no surface or internal routing of traces or runs between or around columns, mounting pads and other traces. Instead, there is a dedicated mesh plane of material for each required interconnect, and such material is internal to structure 10 with the exception of mounting pads 18. Many advantages accrue from this structure. For example, tedious and costly plural, tiny signal routing is avoided, potential bridged lands-produced short circuits are avoided, inter-adjacent-signal crosstalk is greatly reduced, signal level losses due to stray capacitance and resistance are reduced and heat is dissipated at the edge of the signal layer rather than along a tiny signal route. Those of skill in the art will appreciate that ICs are mounted on outer, and preferably upper, dielectric layer 16 having mounting pads 18 thereon, and that the ICs most preferably may be of the flip-chip variety wherein the bottom surface of the chip has regularly arrayed, plural protuberant I/O contacts for wave soldering directly to mounting pads 18.

FIG. 2 also illustrates how power (e.g. VGG, VDD, ground, etc.) is distributed through structure 10. For example, layers 12a, 12c might be VGG and VDD planes for routing required voltages to ICs mounted on the structure. Also, layers 12b, 12d, 12f, 12h, 12i, 12j, 12k might be ground planes for providing an extensive three-dimensional grid that provides ground distribution and buffering of signal and voltage planes thereabout. Such power layers are formed such that there is an integral decoupling capacitor between the adjacent layers that further improves circuit performance by decoupling between the power layers and filtering any circuit-injected noise. The provision of integral decoupling capacitors also reduces module ground bounce.

Figure 3A:
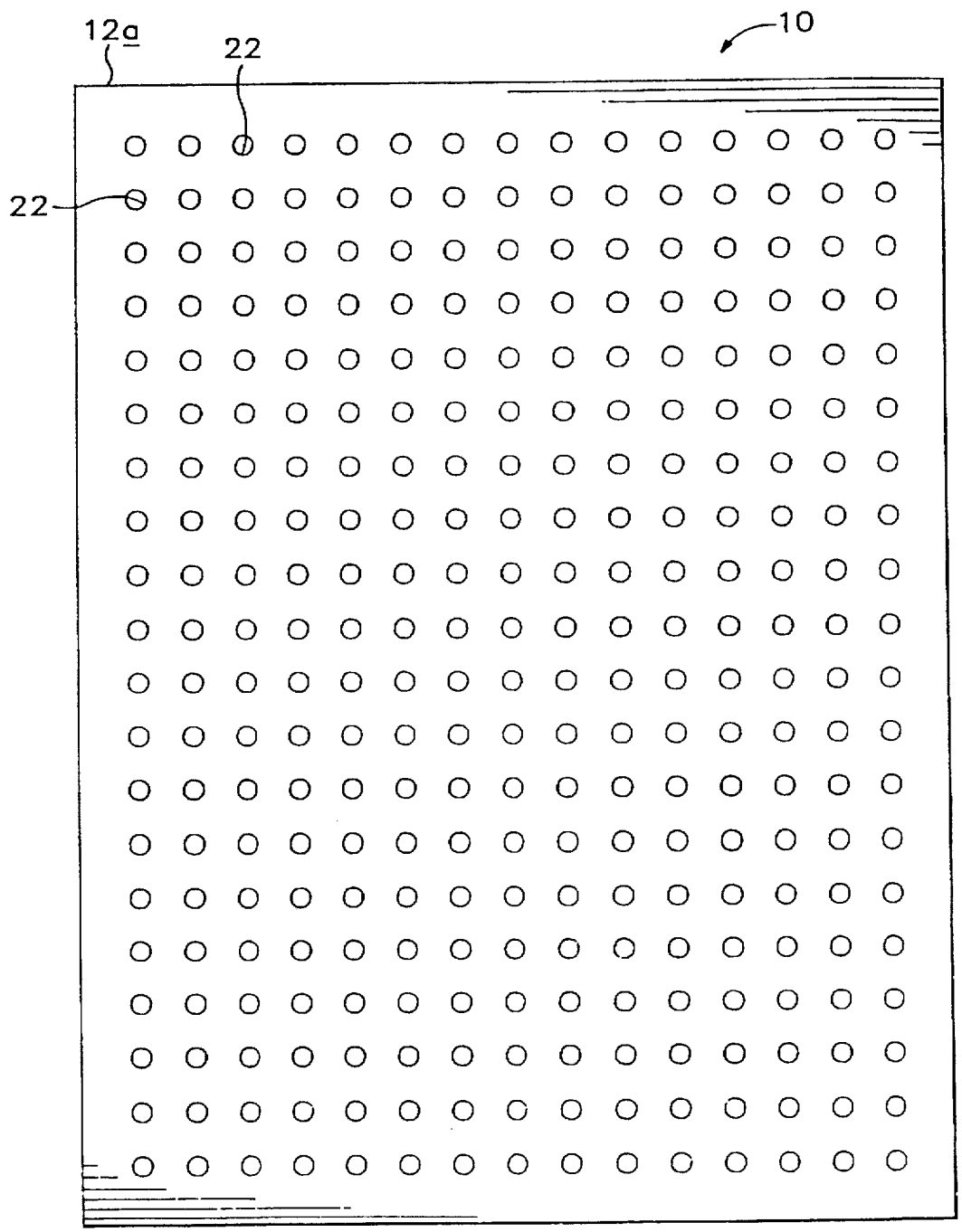

Referring next collectively to FIGS. 3A, 3B, 3C and 3D to be described are a series of steps of a preferred, fusing method of fabrication of structure 10. FIG. 3A is a top plan view of structure 10 (shown minus substrate 14 in FIGS. 3A, 3B, 3C and 3D for the sake of clarity) showing the upper surface of one of the planar conductors, or conductive expanses, e.g. of layer 12a, during a preliminary phase of the fabrication of structure 10, wherein a preferably regular array of pillar holes, or apertures, 22 are formed to extend through stacked layers 12 as shown. In accordance with the preferred embodiment of the invention, apertures 22 are arranged in an orthogonal, square grid extending in two dimensions substantially across the lateral extents of structure 10. Apertures 22 may be formed by any suitable method, although laser ablation has proved to be a preferred method of formation due to its precision, controllability and speed. Those skilled in the art will appreciate that any aperture-forming method is within the spirit and scope of the invention.

FIG. 3B—a fragmentary top plan view of structure 10 corresponding to FIG. 2A—illustrates the next preferred step of the invented fabrication method in which a conductive material is deposited within holes 22 (as indicated by horizontal lining). Any suitably conductive material may be used to provide conductivity through vias 24 from the bottom to the top of plural layers 12. For example, copper metalization may be used to provide a room-temperature deposition and formation of vias 24. A preferred method, however, is believed to be laser-induced chemical vapor deposition (CVD), and a preferred material may be tungsten (W). Tungsten is believed to thermally and adherently compatible with the preferred silicon carbide (SiC) material from which the dielectric regions of layers 12 preferably are formed, and it is possible to laser deposit tungsten very evenly and controllably within holes 22. Tungsten also lends itself well to atomic-scaled deposition in an extremely thin and smooth layer to form the conductive mesh planes that form the complementary regions of layers 12.

FIG. 3C—a fragmentary top plan view of structure 10 corresponding to FIG. 3A—shows the next step in the method of forming structure 10 whereby plural so-called 'vent' apertures 30 are formed in a preferably regular array across structure 10 such that there are preferably four such apertures 30 adjacent each via such as via 24. Preferably, apertures 30 are larger in diameter than holes 22, and most preferably approximately twice the diameter thereof, as shown. Apertures 30 provide a unique structural means for programming substrate 10, as their configuration and placement forms four isthmus-like fusible (openable or interruptable) links, or bridges, 32 (four such associated bridges 32a, 32b, 32c, 32d being so-labeled) between a correspondingly centered via 24 and the surrounding conductive mesh plane. These links permit selective electrical isolation of any or all of vias 24 from a given mesh plane of a given layer.

Figure 3D:
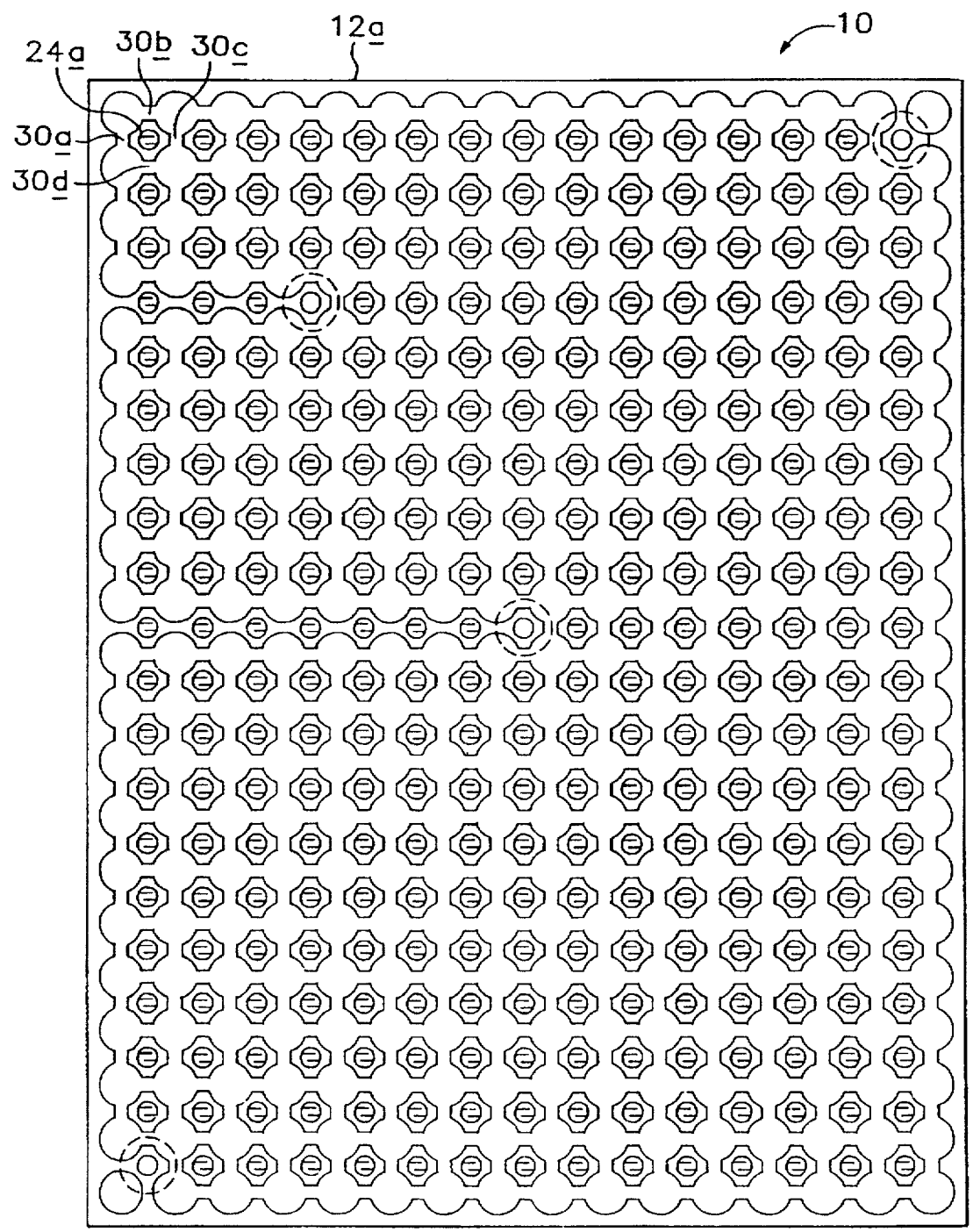

FIG. 3D shows a typical next step of fabricating invented structure 10 whereby the structure is programmed to selectively electrically couple one or more vias 24 with the conductive mesh plane of a given one of layers 12. By a technique that will be referred to herein as fusing, a selected one or more of vias 24 is electrically isolated from the given conductive mesh plane by the application of a potential difference between the selected via 24a and its four immediately surrounding apertures 30a, 30b, 30c, 30d that is sufficient to open the four fuses formed therebetween. It will be appreciated that the potential difference must be below the threshold voltage required to open fuses surrounding the intended via and its surrounding apertures, thereby to leave intact all other conductive links. One at a time, and preferably in an orderly row-and-column or column-and-row fashion, the fusible links surrounding each of plural vias 24 are opened as described, save those one or more of vias 24 that is desired to be electrically connected with the given conductive mesh layer being programmed.

In the illustrated interconnection, it may be seen that the four circled vias 24 are interconnected with one another by fusing all but select ones of bridges 32. The select bridges that may be seen to have been left intact form the interconnection of the four circled vias 24, providing the programmed conductive layer 12a with the ability when an IC is mounted on structure 10 of interconnecting select pins of the IC to define a signal node. It will be appreciated that remaining conductive layers 12b, 12c, 12d, 12e, 12f, 12g, 12h, 12i, 12j, 12k, or any remaining number of layers 12 that form a part of laminar structure 10 (where the number may exceed one thousand or more) would be similarly programmed, thereby defining planar signal interconnect nodal planes buried within the interior of structure 10.

The regularity of the array of apertures 22, 30 and vias 24 render the invented structure highly repeatably fabricated and easily and cost-effectively programmed, as by simply applying—between a selected one or more of the inner conductors of the vias and a selected planar conductor—a voltage or potential difference that provides sufficient power within the region of a selected via to open the bridges connecting it with the planar conductor. Those bridges that remain after all others have been opened may be seen to define a planar nodal interconnect layer such as the singular layer 12a of a plural-layer structure 10. In a typical prior art system of producing multi-layer interconnects wherein multiple signals are routed on each copper-clad layer of, for example, a PCB, as many photolithographic masks are required for etching the copper as there are layers. In the case of the present invention, however, only a single mask, at most, or more preferably no mask, is required since the signal routing is a regular grid, since each of plural layers is dedicated to a single signal that essentially is represented by the entire conductive mesh of the given layer, and since each internal layer's three-dimensional interconnection is electrically programmed by a simple application of an external voltage.

The programming process is repeated layer by layer, preferably under control of a programmer equipped with drive electronics for supplying the potential difference of needed amplitude and duration, until each of plural layers 12 is programmed. If each of n layers 12 has formed therein m vias, then the programming of all n layers 12 will require the controller to scan and selectively leave intact or anti-fuse n×m clusters in order to program the required substrate interconnections. For example, with the 7 by 10 array of vias shown in FIGS. 3A through 3D, and with 1500 layers, 1500×70=105;000 vias and their associated 105,000×4=420, 000 fusible links must be addressed by the programmer and either fused (to isolate the given via from the given layer) or left intact (to form a conductive interconnection therebetween). Such of course may be done in a matter of seconds by any suitably programmed microprocessor or computer and an appropriate electro-mechanical fixture for grasping the structure and applying appropriate potentials thereto between a selected conductive expanse and a selected via.

Those of skill in the art will appreciate that alternative methods for providing selective conductivity between a given layer and a given via are contemplated, and that all are within the spirit and scope of the invention. For example, it is possible to anti-fuse or bridge the insulative gap between a given layer and a given via by a technique that is similar to that described and illustrated herein. In such a case, the dielectric material remaining between a given via 24a and its four surrounding apertures 30 might be rendered conductive by applying sufficient power thereat to cause the amorphous silicon material at least semi-permanently to alter its structure from one exhibiting electrically insulative characteristics to one exhibiting electrically conductive characteristics, thereby producing a conductive path therebetween conducive to current flow.

FIGS. 4A, 4B and 4C illustrate the phases of fabricating interconnect structure 10 by this alternative, preferred, so-called anti-fusing method (again, for the sake of clarity, substrate 14 is not shown and only a top conductive layer 12a is shown in FIGS. 4A, 4B, 4C, 4D). FIGS. 4A, 4B, 4C and 4D are fragmentary top plan views showing only a few of the typically densely hole-patterned structure 10'. As may be seen from FIG. 4A, plural apertures 34 are preferably regularly arrayed, and more preferably arrayed in a square grid, of any desired spacing (depending, it will be appreciated, on the desired number of interconnections desired) to extend through all layers 12 preferably to substrate 14. Apertures 34 may be formed by any suitable method, although they are believed preferably to be formed by laser ablation in like accord with the formation of apertures 22 of the preferred method and apparatus.

FIG. 4B shows the next step of the alternative method of fabricating structure 10 by which a semiconductor material such as amorphous silicon first is deposited within apertures 34 (as indicated by vertical lining), again preferably by laser deposition as in accordance with the preferred method. Those of skill in the art will appreciate that apertures 34 may be formed in any suitable way and may be transformed into vias by alternative steps that are within the spirit and scope of the present invention.

FIG. 4C shows the next step by which plural apertures 22' having a smaller diameter than first plural apertures 34 is formed to be preferably concentric, i.e. within an identical preferably square grid pattern, therewith. It will be appreciated that apertures 22' correspond generally with apertures 22 of the preferred method and apparatus, and thus are nearly identically designated. Apertures 22' also may be formed by preferably by laser ablation, although any suitable method of formation may be used within the spirit and scope of the invention.

Turning next to FIG. 4D, it may be seen that conductive material next is deposited within apertures 22' (as indicated by horizontal lining) to provide columnar conductive vias 24' extending from the top surface of structure 10 through plural layers 12 to bottom substrate 14. Those of skill in the art will appreciate that there is a ring of semiconductor material, e.g. amorphous silicon, between a given planar conductor such as conductive layer 12a and each via 24' extending through that layer. Such semiconductor material may next be programmed by the external application of a voltage to a selected one or more vias and a given conductive layer selectively to change the insulative condition of the semiconductor material typical of its deposition, into a conductive condition of the semiconductor material. Selectively changing the insulative state of the columnar insulative regions surrounding the columnar vias to a conductive state effects an electrical interconnection with the given planar conductor and such selected vias. Programming of lattice interconnect structure 10' may be performed similarly to the manner described above to program structure 10.

It will be understood that the individual layers 12 may be fabricated prior to their stacking by deposition of a conductive coating on a dielectric base. Chemical vapor deposition (CVD) is a conventional technique that may be used, although it is extremely slow, e.g. material is deposited at a rate of approximately 1–10 micrometers per hour (μm/h). It is preferred to use laser ablation, which may operate to deposit a layer of material at a rate as high as approximately 1 nm (thickness) per pulse. With a laser operating at a repetition rate of 100 Hz, deposition of the conductive coating may be performed at a rate of approximately 360 μm/h. Thus, a structure having 2000 conductive layers each 4000 Å thick could be accomplished in less than two hours.

The preferred material for deposition on the surface of the dielectric to produce the conductive expanse again is tungsten (W), which has been found to produce an extremely smooth layer surface. Such permits thinner layers to be used, while ensuring conductivity and continuity requirements are met. It will be appreciated that other materials may be used, such as aluminum/aluminum oxide ($Al/Al_2O_3$) alternatively might be used, although the preferred laser ablation deposition method has not yet been proven with such materials. Any suitable conductive materials and their deposition are contemplated, and are within the spirit and scope of the invention.

It is believed that the pillars, or columnar through vias, may be fabricated using standard techniques for depositing metal and growing amorphous silicon therearound in a thin-film substrate.

Figure 5:
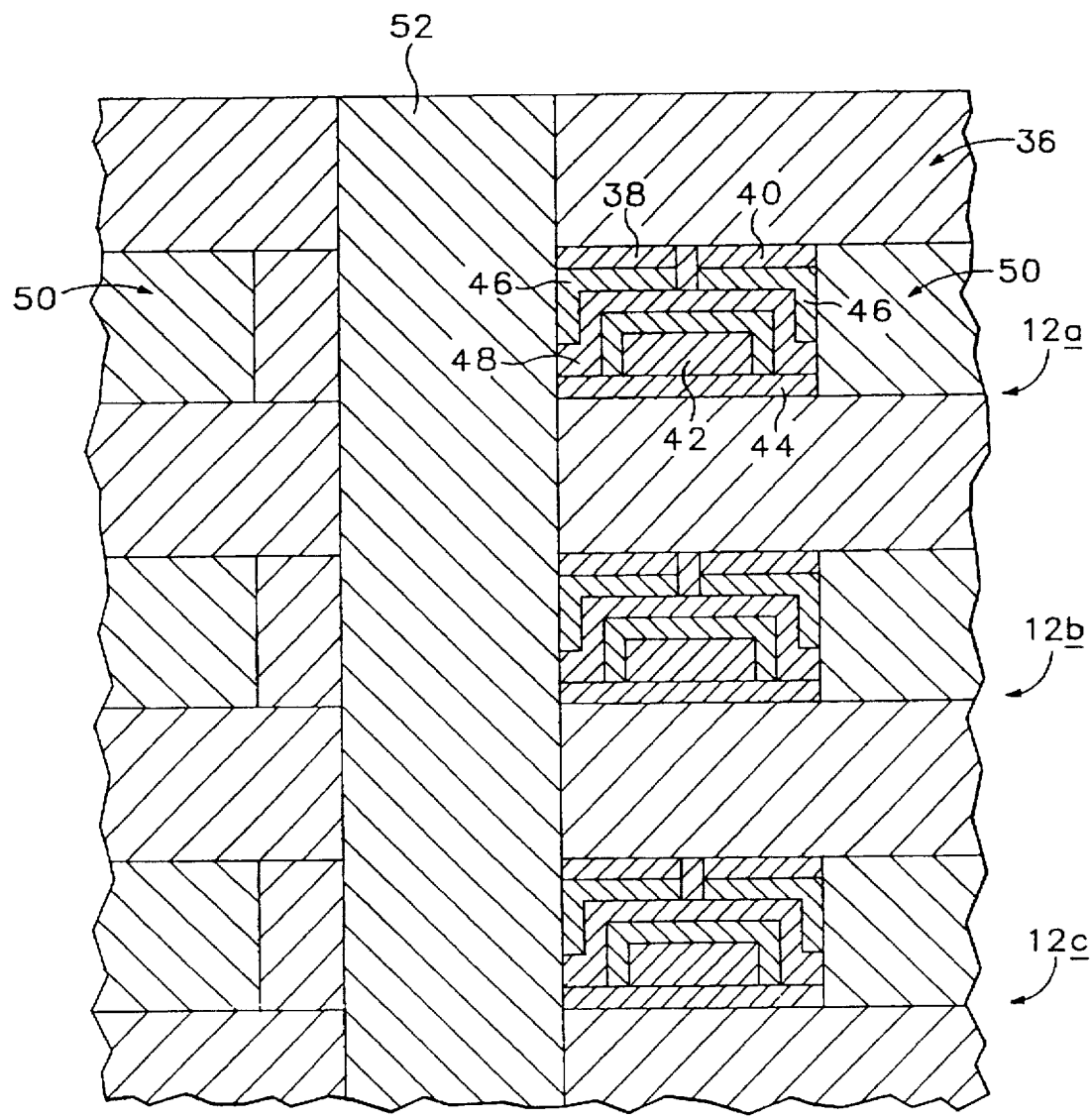
FIG. 5 illustrates an alternative embodiment of the invention in which each via is rendered programmable by fabrication of a switchable thin film transistor at the interface between each layer and each via.

Turning now to FIG. 5, an alternative embodiment of the invented structure is illustrated in which the selective interconnection between a pillar and a layer is rendered reprogrammable by the use of a semiconductor switch 36 formed in the interconnect region. While FIG. 4 shows only three such switches formed between adjacent layers 12a, 12b and 12c and a given pillar, it will be appreciated that preferably such a switch as is shown would be formed at every such interface region throughout a plural layer, plural pillar structure as is described above. Thus, by the control of the thin film, field-effect transistor (FET) that performs the switching function, any pillar may be connected with any layer to program the structure to provide the desired interconnections between surface-mounted ICs. The advantage of such an alternative embodiment of the invention is that there is much more flexibility and that an interconnect scheme may be changed at will by simply signalling a given transistor switch to change, for example, from conducting to isolating or vice versa. This might find great utility during prototype development or other fluid design phases of product research and development.

The transistor switch is shown at 36 as being formed within the deposited conductor layer region and a conductor pillar region corresponding to a potential interconnection therebetween. The transistor preferably includes source-drain electrodes 38, 40 vertically adjacent the structure's upper dielectric layer for biasing the transistor; a floating gate 42 for controlling whether the transistor's semiconductor region is in a conducting or isolating condition; a gate dielectric 44 vertically adjacent the structure's lower dielectric layer; an interface contact 46 for biasing floating gate 42 to switch the transistor, with interface contact 46 being pulsed at a predetermined repetition rate by the external programmer; and a semiconductor region extending between a conductive layer 48 and a conductive pillar 50 and being subject to the state of the floating gate to provide electrical isolation between the layer and the pillar or to provide electrical conduction therebetween depending upon whether such an interconnection is desired.

Programming a structure such as that described herein, wherein the structure utilizes the buried transistor switch selectively to establish layer-pillar interconnections is straightforwardly accomplished by simply commanding the transistor to switch states by driving interface contact 46 to bias floating gate 42. In accordance with this alternative embodiment, there is no fusing or anti-fusing required. On the other hand, there may be considerable programming required, depending upon the number of desired interconnections, and such programming must be performed any time the structure is put to use. Those of skill in the art will appreciate that the transistor switch's internal capacitance acts as a storage element characterized by a decay time period during which the transistor stably remains in the programmed state, and that the external programmer would essentially refresh program each transistor switch within structure 10 at a predefined refresh rate to restore each transistor's desired state, whether on (conductive) or off (insulative).

Figure 6A:
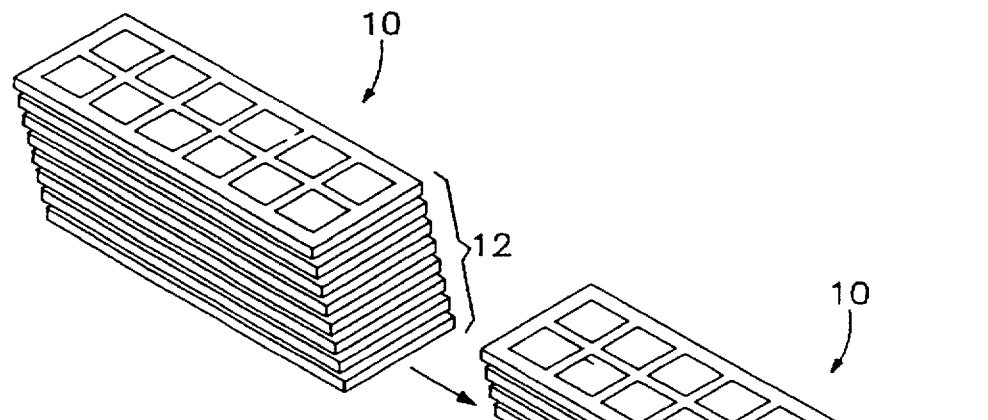
FIGS. 6A, 6B and 6C illustrate in simplified isometric view the manner in which adjacent, edge-stepped structures are interconnected.
Figure 6B:
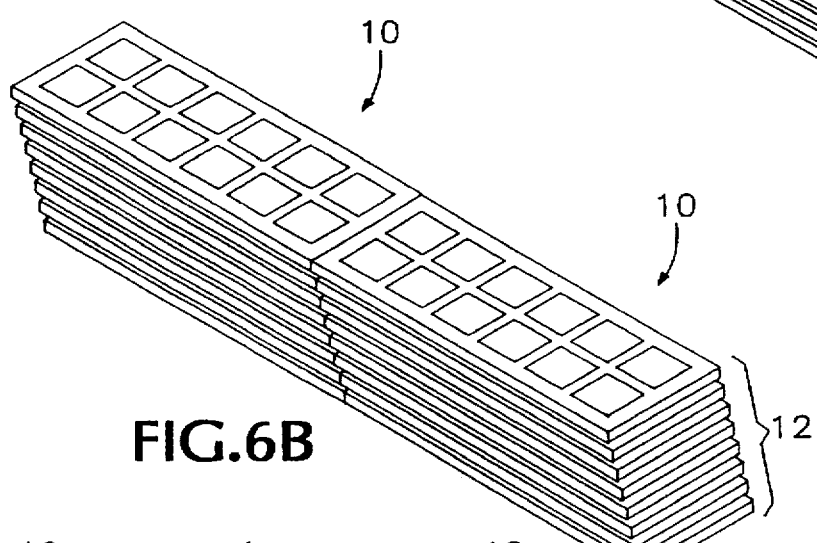
Figure 6C:
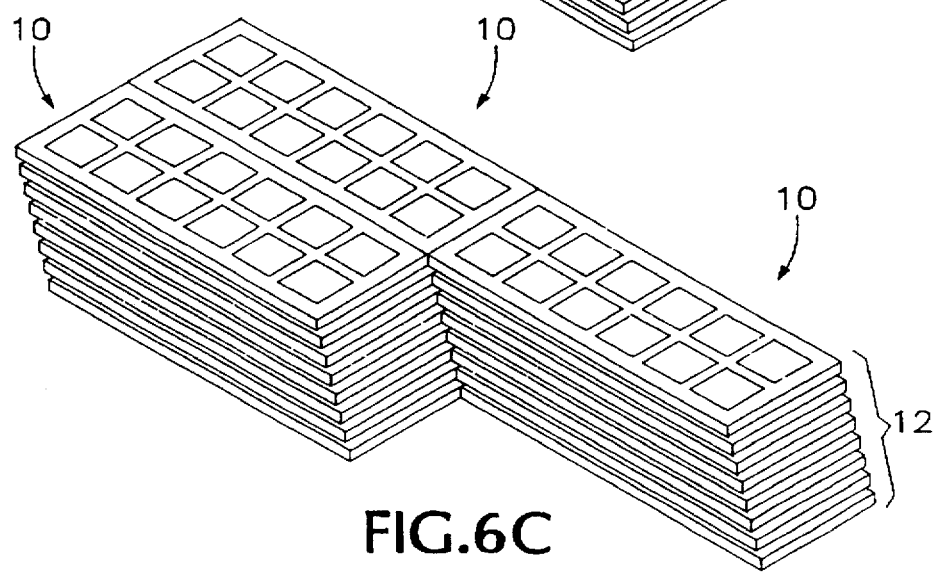

Referring collectively to FIGS. 6A, 6B, 6C, it will be understood that the thickness of various layers 12 within structures 10 are greatly exaggerated for the sake of clarity and that the squares appearing on the top surfaces thereof represent ICs that are mounted on structures 10. Accordingly, FIGS. 6A, 6B, 6C may be thought of as illustrating the interconnection of plural instances of the invented structure in somewhat simplified isometric view. As may be seen best perhaps from FIGS. 2 and 6A, plural layers 12 of structure 10 preferably are regularly, laterally stepped along two or more edges, e.g. four as illustrated, thereby providing a plurality of exposed conductive surfaces corresponding to signal or power layers or nodes for interconnection with other similarly stepped structures, as illustrated in FIGS. 6B and 6C. It will be appreciated that such stepped structures may be arrayed in two (FIG. 6B) or three (FIG. 6C) dimensions, as illustrated, to provide a high level of economical and reliable interconnectivity. Such stepped structures also may connect with other structures such as ribbon cables, PWBs or PCBs having form-fit compatible interconnect schemes. Again, thousands, rather than hundreds, of inter-substrate connections may be provided, thereby increasing many-fold the interconnectivity of substrate assemblies within a system such as a digital signal processor or controller.

The invention now may be understood to be described as follows. Structure 10 may be thought of as a lattice interconnect substrate for mounting on an outer surface thereof one or more electronic devices. Preferably, the substrate includes plural generally planar conductive expanses such as the planar conductors of layers 12 stacked generally normal to their planes; plural insulative expanses such as the planar dielectrics of layer 12 interposing adjacent ones of the conductive expanses; and vias such as vias 24 extending generally normal to the planes of the conductive expanses and between outer layers thereof, with each of the vias having a conductive region such as inner conductor 26 selectively operatively connectable with one or more of the conductive expanses. With the selective connection of two or more given ones of the vias to a given conductive expanse, given ones of the vias will be understood to be operatively connected with one another.

In accordance with one of the preferred embodiments of the invention, the vias further have an insulative region such as sleeve 28 that extends between the conductive region and a via-periphery of each of the conductive expanses, whereby such selective connectability is achieved by changing the insulative characteristic of the insulative region to a conductive characteristic. The conductive and the insulative regions of the vias in this embodiment preferably are of electrically alterable semiconductor material, e.g. amorphous silicon. As described above, vias 24 are programmably selectively connectable with one or more of said plural conductors, as by any of the disclosed and illustrated fusing, anti-fusing or switching techniques.

In accordance with the preferred fusing technique, each of the vias and each of the plural conductors has one or more, e.g. four, fusible conductive links extending therebetween. Such conductive links are associated with one or more selected vias on a given one of the plural conductors, and are fused to electrically disconnect said one or more selected vias from the given one of the plural conductors, as illustrated in FIGS. 2, 3A, 3B, 3C, 3D. In other words, a given one of the first conductors included in one of the layers 12 is electrically connected with one or more of the second conductors included in one of the vias 24 by one or more fusible links, or bridges, 32 extending therebetween. Most preferably in accordance with the disclosed fusing technique, each of the vias and each of the plural conductors has plural ones of the fusible conductive links 32 extending radially outwardly from each of the vias to the given one of the plural conductors, with each of the plural ones of the fusible conductive links associated with one or more selected vias on the given one of the plural conductors being fused to electrically disconnect, as by burning or opening a fuse, the one or more selected vias from the given one of the plural conductors.

In accordance with another aspect of the invention illustrated in FIG. 6 and described above, at least one edge of substrate 10 may include a laterally stepped plurality of the plural conductive layers, with the inclusion being characterized by exposure of the conductive layer for interconnection of the substrate with an external mechanism such as a programming device, another like substrate, an external ribbon cable or the like. Such intermodule connections are made possible by the described and illustrated stacking, with a slight lateral offset, of layers 12 each paired to include a conductive expanse and an associated insulative expanse.

Another important advantage of the invention is the thermal conductivity of structure 10 made in accordance with its preferred embodiment and suggested alternatives thereto. Because of the extensive surface area of the metalization of each of layers 12, any heat generated on a first conductor of a given layer 12, layers 12 essentially act as thermal conductors that remove heat from the interior regions of structure 10 to the edge regions thereof such as the stepped edges shown in FIG. 6 wherein laterally offset first conductors are operatively connectable with external mechanisms. It will be appreciated that, by providing a heatsink structure as the external mechanism any heat generated by circuitry on structure 10 and conductively radiated by layers 12 to the edges thereof may be radiated away from structure 10 by the thermally operatively connected heatsink structure, which may be of otherwise conventional design but with an edge connector that is physically compatible for mating with one or more edges of structure 10. Obviously, in such a case where a heatsink is used, one or more un-heatsinked edges of structure 10 may be used as described and illustrated herein to provide I/O signal interconnections with other electronic circuits or equipment.

The invention alternatively may be described as follows. Structure 10 may be thought of as a three-dimensionally routed signal interconnect structure that includes plural stacked expanses such as layers 12 extending generally in a first plane, with each of the expanses including a first conductor and a first insulator; plural vias 24 extending generally normal to the first plane, with each of the vias including a second conductor such as inner conductor 26 extending therethrough, whereby the expanses and the vias are provided in a slightly less than substantially one-to-one ratio (e.g. a one-to-one ratio would represent a somewhat unusual case in which no IC contact is interconnected with another but instead each is connected to an external module via the stepped edge connector of structure 10, as described below by reference to FIG. 6); a two-to-one ratio would represent a more typical case in which there are on average two IC contacts interconnected with one another within the same structure 10; an X-to-one ratio, where X≥3, would represent a less typical case in which there are on average three or more IC contacts interconnected within one another within the same structure 10); and means for selectively interconnecting a given first conductor with one or more desired ones of the second conductors to produce a signal interconnect node. Those skilled in the art will appreciate that by substantially one-to-one ratio is meant any ratio substantially higher than the prior art ratios, e.g. 1:100, where hundreds of signal nodes are routed as tiny land patterns each of a few layers, for example, of a PCB.

Preferably, the first conductors extend substantially coextensive with the planar expanses, and wherein the plural expanses or layers 12 are adhered to one another with terminal edges thereof being spaced apart generally within the first plane to produce at least one edge region of the structure exposing stepped plural first conductors for electrical interconnection with another structure. Such is illustrated in FIG. 6 and is described in some detail above. Again, those of skill in the art will appreciate the flexibility of inter-structural interconnections rendered possible by this important feature of the invention by which external modules—whether other such invented structures 10, ribbon cable connectors, wire harnesses or heatsinks or alternative I/O mechanisms—may be operatively interconnected with structure 10.

Also preferably, each of the vias further includes an outer sleeve such as sleeve 28 extending substantially around an included first conductor such as inner conductor 26, and wherein each of the outer sleeves is formed of semiconductor material capable of being configured selectively to conduct or to block current between a given one of the first conductors and one or more of the second conductors. Such is illustrated in FIGS. 4A, 4B, 4C, 4D and 5, and is described herein as the anti-fusing and the switching technique. In such embodiments of the invention, the semiconductor material is programmably switchable between a current-conducting and a current-blocking state, whether it is programmable typically once only as by the anti-fusing technique or whether it is programmable over and over as by the switching technique.

In accordance with the anti-fusing technique described herein, the semiconductor material may be an amorphous crystalline structure that is capable of being rendered either electrically insulative or electrically conductive by the application of a defined voltage between a selected one of the first conductors and a second one of the second conductors. Those of skill in the art will appreciate that such semiconductor material may be programmed by an external programmer capable of applying a voltage between a selected layer and a selected via.

In accordance with this aspect of the invention, the semiconductor material forms a switching device extending between each of the first conductors and each of the second conductors, with the switching device, e.g. a transistor, being switchable by external programming means to render the semiconductor material alternatively in a first or a second state. Preferably, a first programmable state is conductive, thereby to operatively electrically connect selected ones of the first and the second conductors. Preferably a second programmable state is insulative, thereby to electrically disconnect selected ones of the first and the second conductors. Such a switching lattice structure is illustrated in FIG. 6 and is described in detail above.

Yet another way of describing the invention is as a three-dimensional signal-routing apparatus including a generally planar laminar structure 10 including plural stacked conductive expanses such as layers 12 extending in two dimensions substantially coextensive with said structure (as is best illustrated, perhaps in FIGS. 3A, 3B, 3C, 3D, 4A, 4B, 4C, 4D), each of the conductive expanses being supported on a dielectric base extending also in two dimensions substantially coextensive with said structure. Such apparatus further includes plural conductive vias 24 extending through the laminar structure generally normal to the plane thereof, with each of the vias being selectively electrically connectable with one or more of the electrical expanses to route a signal along a connected via to the one or more electrical conductors.

Preferably, two or more of such plural vias are connected with one of the electrical expanses to route a signal between the two or more of such plural vias. Such will be understood by those of skill in the art to represent a signal node, and to provide structure 10 with the ability to interconnect two or more connector or mounting pads 18 to which the I/O contacts of one or more ICs are connected. Thus, a signal may be routed between the I/O contacts of a single IC mounted on structure 10, or a signal may be routed between an I/O contact of one such IC and an I/O contact of another such IC. It will be appreciated that any number of I/O contacts may thus be interconnected by the three-dimensional lattice structure described and illustrated herein, within the spirit and scope of the invention.

Again referring to FIG. 6, the laminar structure preferably terminates in an edge where the plural conductive expanses terminate at incrementally differing extents within the plane of the structure to produce a stair-stepped edge, wherein said electrical expanses are exposed at the stair-stepped edge of the structure for signal interconnection with external apparatus. Skilled persons will appreciate that such stair-stepping for external connections of structure 10 and such three-dimensional signal node interconnections within structure 10 are related but practicable independently from one another, and that their combination is especially advantageous in highly densified circuit and system designs.

A preferred method of fabricating an interconnect structure for mounting electronic devices now may be understood, in light of the above description of various embodiments of the invented apparatus. The method will be understood to include the steps of 1) stacking plural generally planar expanses to produce a laminate, each expanse having a substantially coextensive conductor electrically isolated from an adjacent stacked expanse by an interposing insulator, as is described in relation to plural stacked planar layers 12; 2) first forming a first set of plural holes, e.g. holes or apertures 22, in the laminate, with the holes of the first set extending generally normal to the plane of the expanses; 3) substantially filling the holes of the first set with a conductive material, as described and illustrated herein; 4) second forming a second set of plural holes, e.g. holes or apertures 30, in the laminate, with a plurality of holes of the second set being positioned in a cluster substantially surrounding each of the holes in the first set, with the second forming step leaving plural conductive isthmuses, e.g. isthmus-shaped links or bridges 32, between each of the holes of the first set and each of the corresponding holes of the second set of holes; and 5) applying a voltage between the conductor within a filled hole and a conductor of the expanse, the voltage being sufficient to open the plural isthmuses thus to electrically isolate the selected hole from the selected expanse but the voltage being insufficient to open the plural isthmuses associated with the remaining holes and the remaining expanses. Such method steps are illustrated in FIGS. 3A, 3B, 3C, 3D, and represent a most preferred method of fabricating structure 10.

Preferably, the first forming step is performed by laser ablation, although it will be understood that any suitable forming technique, e.g. high-speed drilling, may be used. Also preferably, the second forming step is performed by laser ablation, although again it will be understood that any suitable forming technique similarly may be used. Preferably, the filling step is performed by laser deposition, although it will be understood that any suitable filling technique, e.g. sputtering, plating or soldering, may be used. Preferably, the applying step is repeated for successive ones of selected holes and selected expanses and it will be understood that the repeated applying steps preferably are performed by executing instructions within a computer-controlled programmer, e.g. a properly application-coded engineering workstation. Preferably, prior to the stacking step, the method further includes forming each of the expanses by laser deposition of a layer of conductive material on an associated insulator, most preferably in accordance with invention by PLD of tungsten (W) onto silicon carbide (SiC).

The programmable nature of invented lattice structure 10 makes for a very quick turnaround in prototyping and production of the densely packed IC-mounting substrate assemblies, since a customer would need to provide only a net list or node list to a programmer or controller for selective application of a voltage to perform the required fusing, anti-fusing or switching. It will be appreciated that more than one pillar typically would be connected—whether by fusing, anti-fusing or switching—to produce a node represented by the given conductive layer, thereby producing a node. Because nodes are created through a three-dimensional, vertical columnar/horizontal planar lattice, they permit a much higher level of interconnectivity (e.g. up to 10,000 interconnects as opposed to a few hundred), while providing also better protection against signal cross-talk, current density and thermal build-up problems.

Other advantages of the proposed interconnect scheme are that each node has greater thermal conductivity because of the planar conductive extensive layer, and a misprogrammed node is reparable by reversing or repeating the process by which it was created. For example, if 2,000 interconnects are required, then 2,500 layers might be provided, thereby providing 25% redundancy such that if a given layer is disabled by misprogramming or by a circuit design change, a different interconnection can be made by simply fortifying the insulator thereby to disconnect the given pillar from the given layer and then by connecting a different layer to the same pillar.

Moreover, substrate assemblies made in accordance with the invention are denser, simpler, more reliable, lighter in weight and of less cost than conventional thin-film, tiny-pattern, plural-signal-per-layer substrate assemblies. Because conductive paths defining circuit nodes are extensive and generally planar, they may lend themselves to superconductor applications impossible with the use of tiny-patterned signal routing. For example, because many known superconductor materials—when used in tiny-patterned signal routing as is conventionally used in MCMs and other PCB structures—are unreliable as electrical conductors, the planar mesh first conductor described and illustrated herein renders possible heretofore impossible multi-layer superconductor IC-mounting structures. It will be appreciated that such superconductor structures are within the spirit and scope of the invention.

Those of skill in the art also will appreciate that alternative interconnection means between two or more columnar vias within a structure such as invented structure 10 are possible, whether they be electrical, optical or some other form of electromagnetic conduction or induction. Such alternative interconnections techniques that provide for the operative interconnection of one or more of plural structure-mounted IC contacts and one or more of plural signal node layers are contemplated, and are within the spirit and scope of the invention.

Accordingly, while the present invention has been shown and described with reference to the foregoing preferred method and apparatus, it will be apparent to those skilled in the art that other changes in form and detail may be made therein without departing from the spirit and scope of the invention as defined in the appended claims.

I claim:

1. A method of fabricating an interconnect structure for mounting circuit modules, the method comprising:

stacking plural generally planar expanses to produce a laminate, each expanse having a substantially coextensive conductor electrically isolated from an adjacent stacked expanse by an interposing insulator;

first forming a first set of plural holes in the laminate, with the holes of the first set extending generally normal to the plane of said expanses;

substantially filling the holes of the first set with a conductive material;

second forming a second set of plural holes in the laminate, with a plurality of holes of the second set being positioned in a cluster substantially surrounding each of the holes in the first set, said second forming leaving plural conductive isthmuses between each of the holes of the first set and each of the corresponding holes of the second set of holes; and applying a voltage between the conductor within a filled hole and a conductor of said expanse, the voltage being sufficient to open the plural isthmuses thus to electrically isolate the selected hole from the selected expanse but the voltage being insufficient to open the plural isthmuses associated with the remaining holes and the remaining expanses.

2. The method of claim 1, wherein said first forming step is performed by laser ablation.

3. The method of claim 1, wherein said second forming step is performed by laser ablation.

4. The method of claim 1, wherein said filling step is performed by laser deposition.

5. The method of claim 1 in which said applying step is repeated for successive ones of selected holes and selected expanses, wherein said repeated applying steps are performed by executing instructions within a computer-controlled programmer.

6. The method of claim 1 which further comprises, prior to said stacking, forming each of said expanses by laser deposition of a layer of conductive material on an associated insulator.

* * * * *